(12) United States Patent
Choi et al.

(10) Patent No.: US 9,634,039 B2
(45) Date of Patent: Apr. 25, 2017

(54) SION GRADIENT CONCEPT

(71) Applicant: Applied Materials, Inc., Santa Clara, CA (US)

(72) Inventors: Soo Young Choi, Fremont, CA (US); Tae Kyung Won, San Jose, CA (US); Dong-Kil Yim, Pleasanton, CA (US); Yi Cui, San Jose, CA (US); Xuena Zhang, San Jose, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

(21) Appl. No.: 15/202,070

(22) Filed: Jul. 5, 2016

(65) Prior Publication Data

US 2017/0012064 A1 Jan. 12, 2017

Related U.S. Application Data

(60) Provisional application No. 62/190,234, filed on Jul. 8, 2015.

(51) Int. Cl.
*H01L 51/52* (2006.01)
*H01L 27/12* (2006.01)
*H01L 27/32* (2006.01)

(52) U.S. Cl.
CPC ...... *H01L 27/1248* (2013.01); *H01L 27/3262* (2013.01)

(58) Field of Classification Search
CPC .............. H01L 27/3262; H01L 27/3248; H01L 51/5271; H01L 51/5275
See application file for complete search history.

(56) References Cited

U.S. PATENT DOCUMENTS

| 5,994,836 | A | 11/1999 | Boer et al. | |
|---|---|---|---|---|
| 6,157,426 | A | 12/2000 | Gu | |
| 6,429,538 | B1 | 8/2002 | Lin | |
| 2003/0160247 | A1* | 8/2003 | Miyazawa | H05B 33/22 257/79 |
| 2010/0159792 | A1* | 6/2010 | Visser | H01L 51/5234 445/58 |
| 2010/0255190 | A1 | 10/2010 | Li et al. | |
| 2010/0297365 | A1 | 11/2010 | Curd | |
| 2012/0001191 | A1 | 1/2012 | Ma et al. | |
| 2014/0264316 | A1* | 9/2014 | Setz | H01L 51/5268 257/40 |
| 2016/0072101 | A1* | 3/2016 | Choi | H01L 51/0097 257/40 |
| 2016/0149153 | A1* | 5/2016 | Scharner | H01L 51/5206 257/40 |
| 2016/0322602 | A1* | 11/2016 | Jung | H01L 51/0097 |

FOREIGN PATENT DOCUMENTS

| CN | 1929705 A | 3/2007 |
|---|---|---|
| JP | 3989666 B2 | 10/2007 |
| JP | 2011191571 | 9/2011 |
| WO | 2008139370 A1 | 11/2008 |

OTHER PUBLICATIONS

International Search Report and Written Opinion dated Sep. 28, 2016 for Application No. PCT/US2016/037618.

* cited by examiner

*Primary Examiner* — Thao P Le
(74) *Attorney, Agent, or Firm* — Patterson + Sheridan, LLP

(57) ABSTRACT

Embodiments of the present disclosure generally relate to methods and devices for use of low temperature polysilicon (LTPS) thin film transistors in liquid crystal display (LCD) and organic light-emitting diode (OLED) displays.

21 Claims, 7 Drawing Sheets

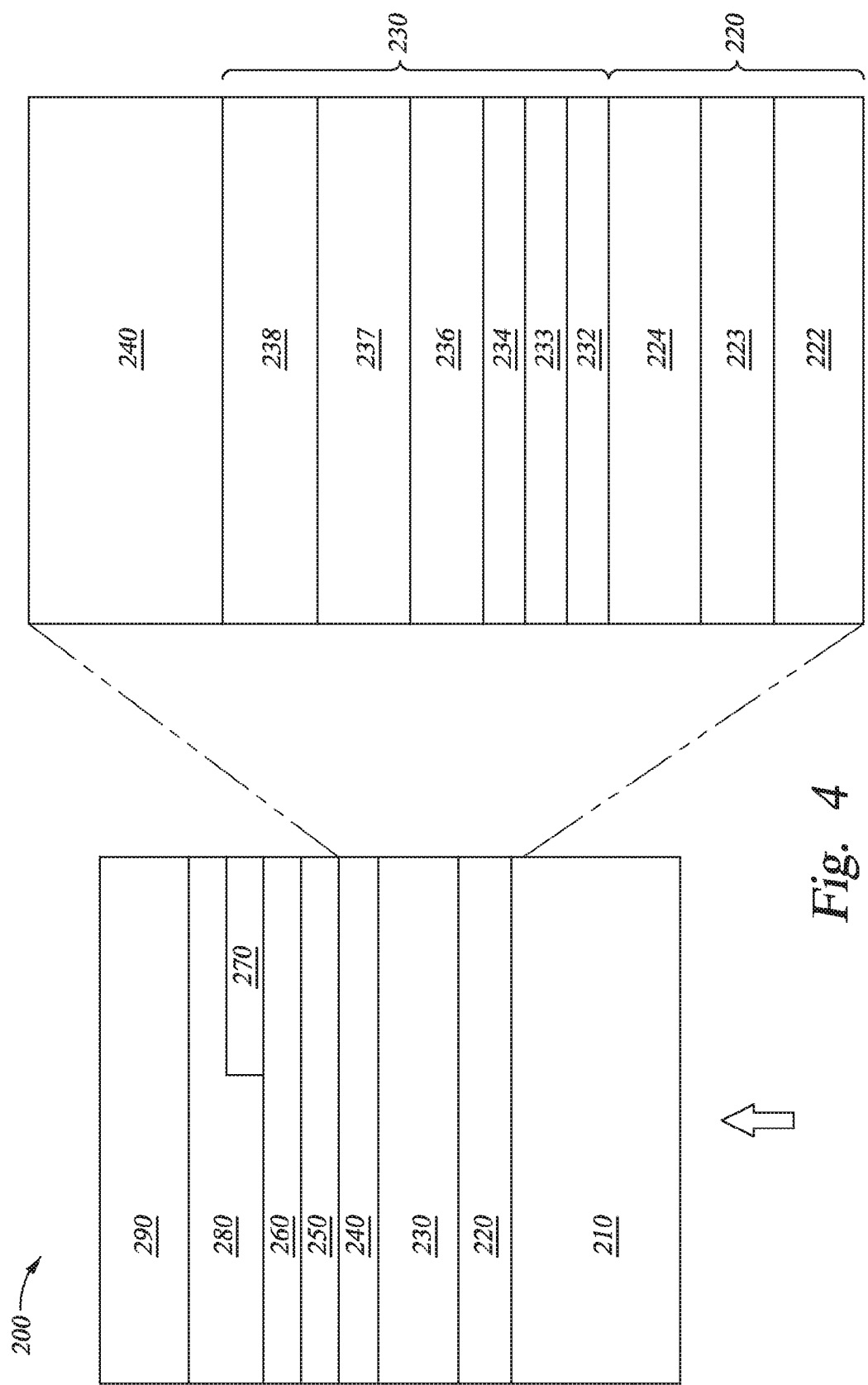

SION GRADIENT CONCEPT

CROSS-REFERENCE TO RELATED APPLICATIONS

This application claims benefit of U.S. Provisional Patent Application Ser. No. 62/190,234, filed Jul. 8, 2015, which is herein incorporated by reference.

BACKGROUND

Field

Embodiments of the present disclosure generally relate to methods and devices for use of low temperature polysilicon (LTPS) thin film transistors in liquid crystal display (LCD) and organic light-emitting diode (OLED) displays.

Description of the Related Art

Low-temperature polycrystalline silicon (LTPS) is important for display technologies because of the temperature restrictions inherent in the use of large glass panels. Use of low-temperature polysilicon produces thin film transistors (TFTs) with improved semiconductor performance, allowing higher resolution displays. Therefore, LTPS TFTs offer possibilities for improved electronic devices such as liquid crystal display (LCD) and organic light-emitting diode (OLED) displays.

As LCD and OLED technologies improve, there is a drive for greater resolution. One hindrance to improved resolution is optical transmittance of light between layers of the LTPS TFT. In particular, when adjacent layers have different refractive indices, optical transmittance is reduced, limiting resolution. One method for improving resolution is to improve optical transmittance of light between layers of the LTPS TFT.

Therefore, there is a need for improved optical transmittance in LTPS TFT.

SUMMARY

Embodiments described herein generally relate to LCD and OLED devices with LTPS technology that include internal layers with matched refractive indices for improved optical transmittance.

More particularly, the embodiments described herein relate to an LCD or OLED device with two dual layers disposed over a substrate, each dual layer comprising a first inorganic layer having a first refractive index; a second inorganic layer having a second refractive index, the first refractive index being less than the second refractive index; and a transition stack disposed between the first inorganic layer and the second inorganic layer, the transition stack comprising at least a third inorganic layer and a fourth inorganic layer. Within the transition stack, the third inorganic layer is disposed on the first inorganic layer and has a third refractive index; the fourth inorganic layer is disposed on the third inorganic layer and has a fourth refractive index; the third refractive index is greater than the first refractive index and less than the fourth refractive index; and the fourth refractive index is greater than the third refractive index and less than the second refractive index. A liquid crystal layer is disposed over the two dual layers.

Embodiments described herein also relate to an LCD or OLED device with a gate insulator dual layer and an interlayer dielectric layer disposed over a glass substrate. The gate insulator dual layer comprises a first inorganic layer having a first refractive index; a second inorganic layer having a second refractive index, the first refractive index being less than the second refractive index; and a transition stack disposed between the first inorganic layer and the second inorganic layer. The transition stack comprises at least a third inorganic layer and a fourth inorganic layer. The third inorganic layer is disposed on the first inorganic layer and has a third refractive index. The fourth inorganic layer is disposed on the third inorganic layer and has a fourth refractive index. The third refractive index is greater than the first refractive index and less than the fourth refractive index. The fourth refractive index is greater than the third refractive index and less than the second refractive index. The interlayer dielectric layer is disposed over the gate insulator dual layer. The interlayer dielectric layer comprises a fifth inorganic layer having a fifth refractive index; a sixth inorganic layer having a sixth refractive index, the fifth refractive index being less than the sixth refractive index; and a transition stack disposed between the fifth inorganic layer and the sixth inorganic layer. The transition stack comprises at least a seventh inorganic layer and an eighth inorganic layer. The seventh inorganic layer is disposed on the fifth inorganic layer and has a seventh refractive index. The eighth inorganic layer is disposed on the seventh inorganic layer and has an eighth refractive index. The seventh refractive index is greater than the fifth refractive index and less than the eighth refractive index. The eighth refractive index is greater than the seventh refractive index and less than the sixth refractive index. A liquid crystal layer is disposed over the interlayer dielectric layer.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this invention and are therefore not to be considered limiting of its scope, for the disclosure may admit to other equally effective embodiments.

FIG. 4 is a schematic cross-sectional view of a thin film transistor device according to another embodiment.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Embodiments described herein generally provide methods and devices for use of low temperature polysilicon (LTPS) thin film transistors in liquid crystal display (LCD) and organic light-emitting diode (OLED) displays. In the description that follows, reference will be made to a plasma enhanced chemical vapor deposition (PECVD) chamber, but it is to be understood that the embodiments herein may be practiced in other chambers as well, including high density plasma (HDP) deposition, physical vapor deposition (PVD) chambers, etching chambers, semiconductor processing chambers, solar cell processing chambers, and organic light emitting display (OLED) processing chambers to name only a few. Suitable chambers that may be used are available from AKT America, Inc., a subsidiary of Applied Materials, Inc., Santa Clara, Calif. It is to be understood that the embodiments discussed herein may be practiced in chambers available from other manufacturers as well.

Figure 1:
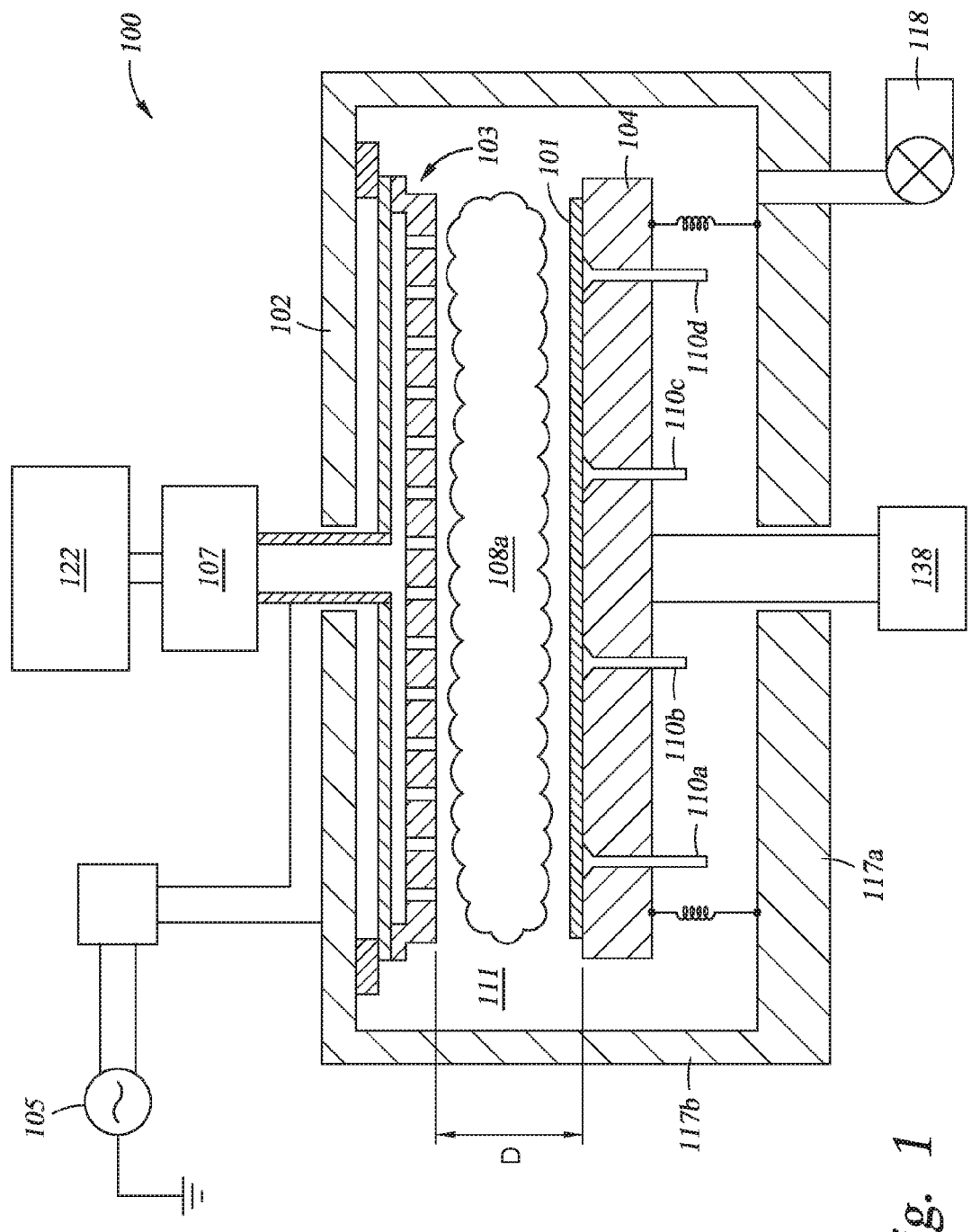
FIG. 1 is a schematic cross-sectional view of a plasma processing system according to one embodiment.

FIG. 1 is a schematic cross-sectional view of a plasma processing system 100 according to one embodiment. The plasma processing system 100 is configured to process a large area substrate 101 using plasma in forming structures and devices on the large area substrate 101 for use in the fabrication of liquid crystal displays (LCD's), flat panel displays, organic light emitting diodes (OLED's), or photovoltaic cells for solar cell arrays. The substrate 101 may be a thin sheet of metal, plastic, organic material, silicon, glass, quartz, or polymer, among other suitable materials. The structures may be thin film transistors which may comprise a plurality of sequential deposition and masking steps. Other structures may include p-n junctions to form diodes for photovoltaic cells.

As shown in FIG. 1, the plasma processing system 100 generally comprises a chamber body 102 including a bottom 117a and sidewalls 117b that at least partially defines a processing volume 111. A substrate support 104 is disposed in the processing volume 111. The substrate support 104 is adapted to support the substrate 101 on a top surface during processing. The substrate support 104 is coupled to an actuator 138 adapted to move the substrate support at least vertically to facilitate transfer of the substrate 101 and/or adjust a distance D between the substrate 101 and a showerhead assembly 103. One or more lift pins 110a-110d may extend through the substrate support 104.

The showerhead assembly 103 is configured to supply a processing gas to the processing volume 111 from a processing gas source 122. The plasma processing system 100 also comprises an exhaust system 118 configured to apply negative pressure to the processing volume 111.

During processing, one or more processing gases is flowed to the processing volume 111 from the gas source 122 through the showerhead assembly 103. A radio frequency (RF) power is applied from a RF power source 105 to generate a plasma 108a from the processing gases. The plasma 108a is generated between the showerhead assembly 103 and the substrate support 104 for processing the substrate 101. The RF power source 105 may also be used to maintain energized species or further excite cleaning gases supplied from the remote plasma source 107.

Figure 2:
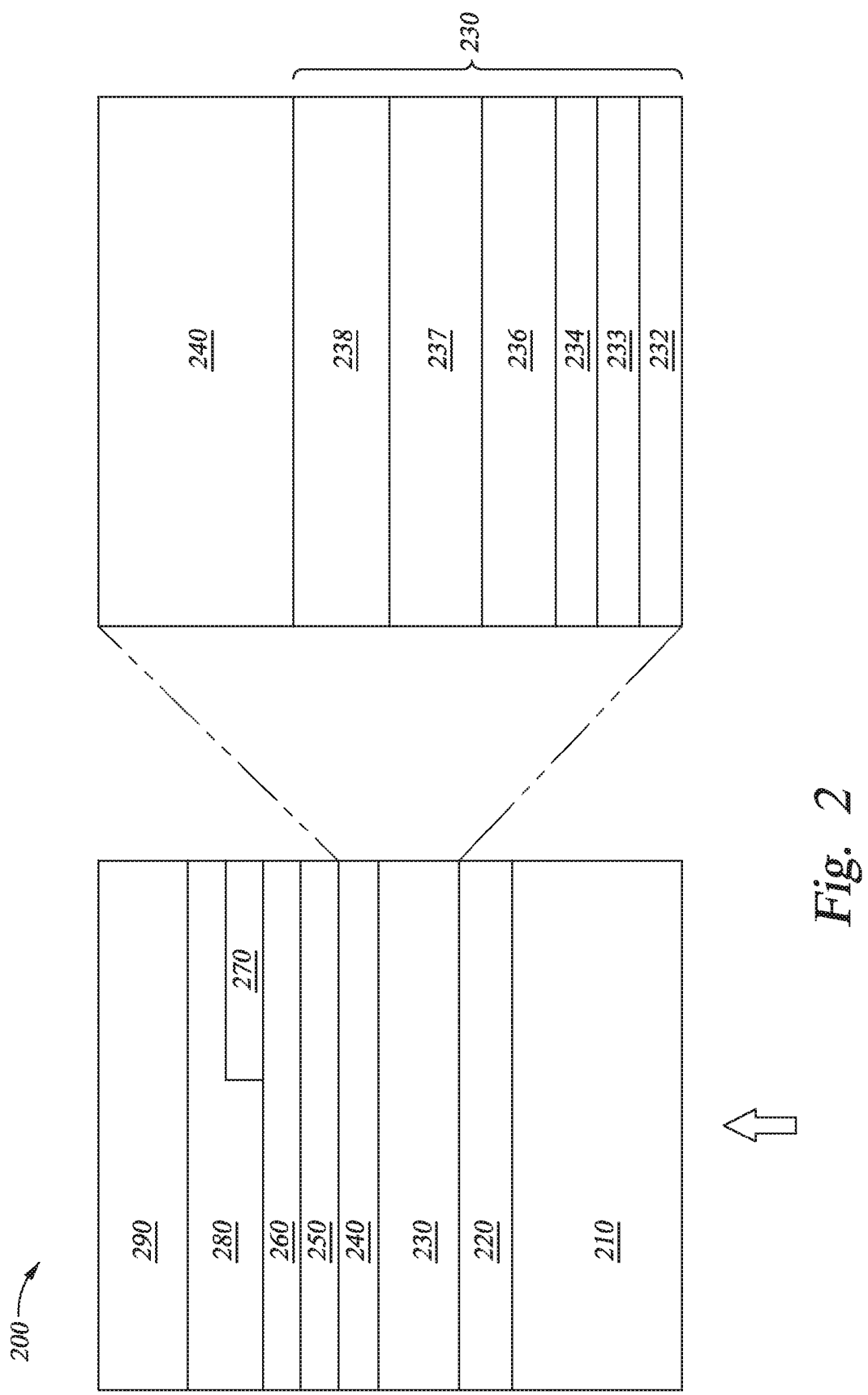
FIG. 2 is a schematic cross-sectional view of a thin film transistor device according to one embodiment.
Figure 6:
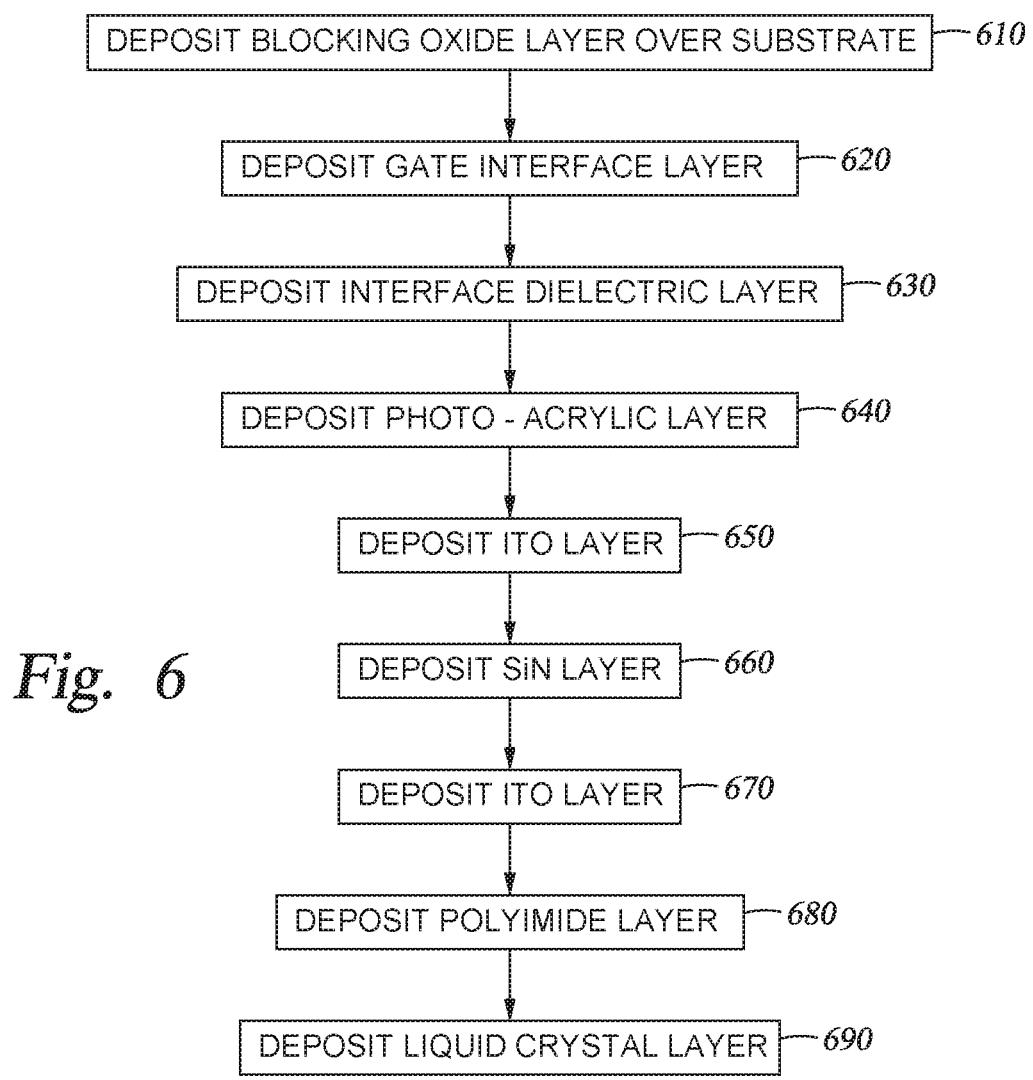
FIG. 6 is a block diagram showing a method of fabrication of a thin film transistor device according to one embodiment.

FIG. 2 is a schematic cross-sectional view of a thin film transistor device that may be created by the apparatus of FIG. 1. FIG. 6 provides a block diagram 600 showing a method of fabrication of a thin film transistor such as the embodiment shown in FIG. 2. A substrate 210, usually of glass, is provided. A buffer layer 220 is disposed over the glass substrate (see block 610 of FIG. 6). The buffer layer 220 may comprise a blocking oxide such as an inorganic material such as silicon oxide (SiO) or a silicon nitride (SiN), or any material suitable for blocking sodium (Na) or other materials from the glass substrate. A gate interface and interlayer dielectric 230 is disposed over the buffer layer 220 (see blocks 620 and 630 of FIG. 6). The gate interface and interlayer dielectric 230 may also comprise one or more inorganic layers. A photoacrylic layer 240 is disposed over the interlayer dielectric 230 (see block 640 of FIG. 6). An indium-tin-oxide (ITO) layer 250 is disposed over the photoacrylic layer 240 (see block 650 of FIG. 6). A silicon nitride (SiN) layer 260 is disposed over the ITO layer 250 (see block 660 of FIG. 6). Another ITO layer 270 may be disposed over all or part of the SiN layer 260 (see block 670 of FIG. 6). A polyimide layer 280 is disposed over the SiN layer 260 and the exposed portion, if any, of the ITO layer 260 (see block 680 of FIG. 6). The top layer of the stack is a liquid crystal layer 290 (see block 690 of FIG. 6).

Figure 7A:
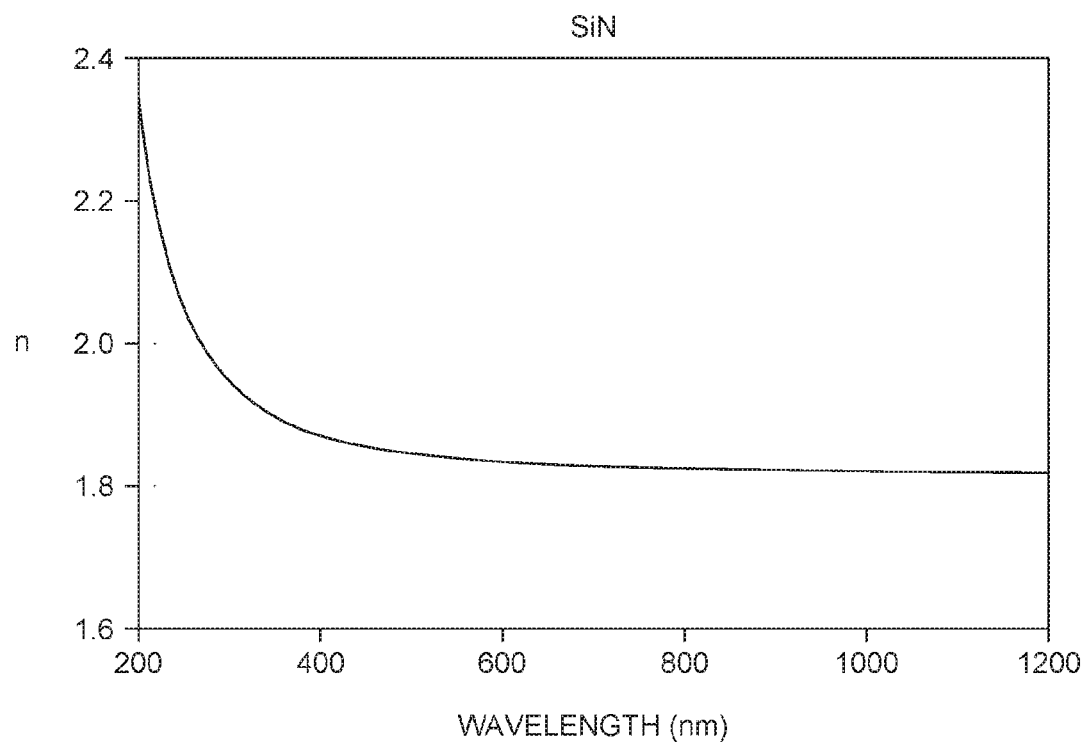
FIG. 7A is a chart mapping typical energy-dispersive n values over a range of wavelengths for a SiN layer.
Figure 7B:
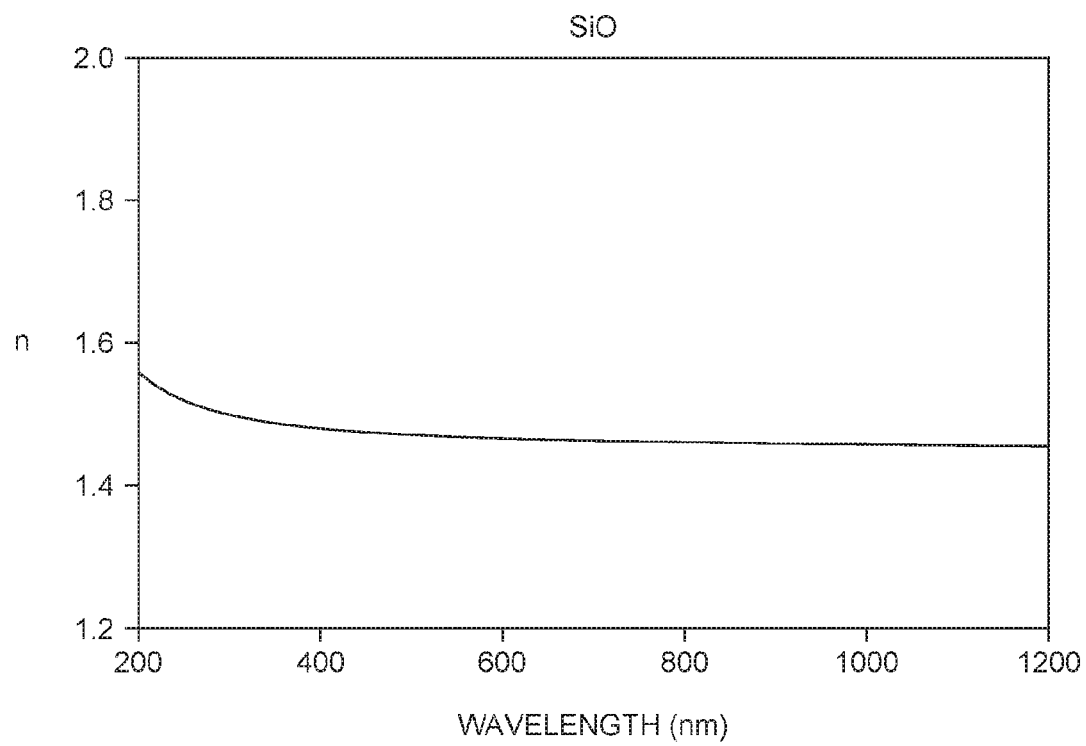
FIG. 7B is a chart mapping typical energy-dispersive n values over a range of wavelengths for a SiO layer.
Figure 8A:
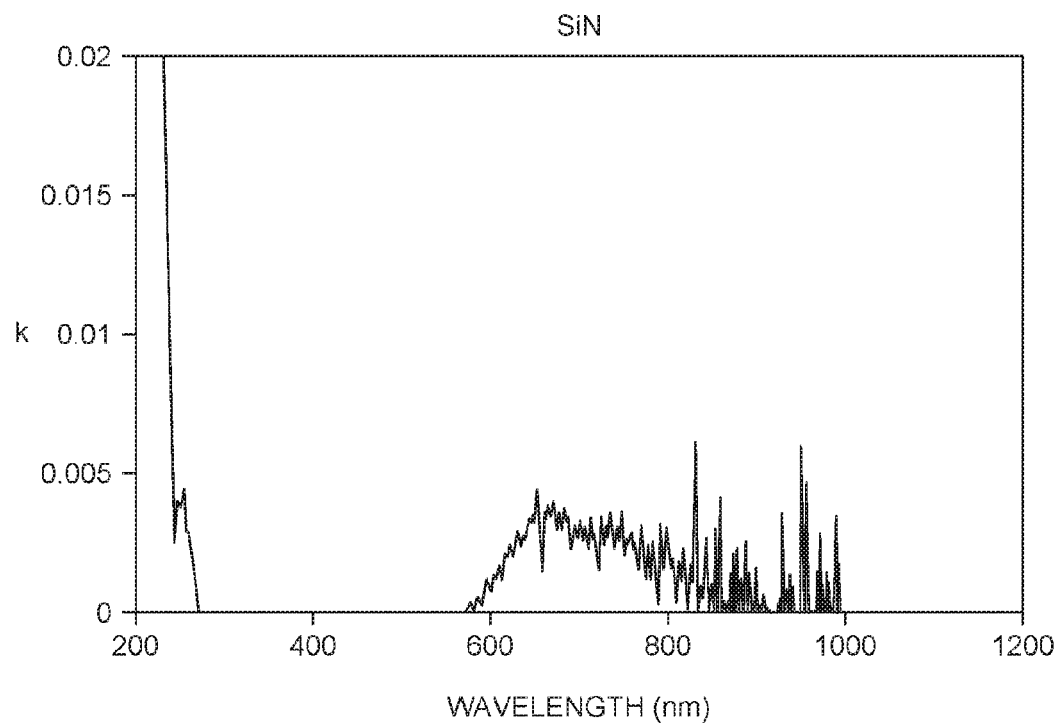
FIG. 8A is a chart mapping typical energy-dispersive k values over a range of wavelengths for a SiN layer.
Figure 8B:
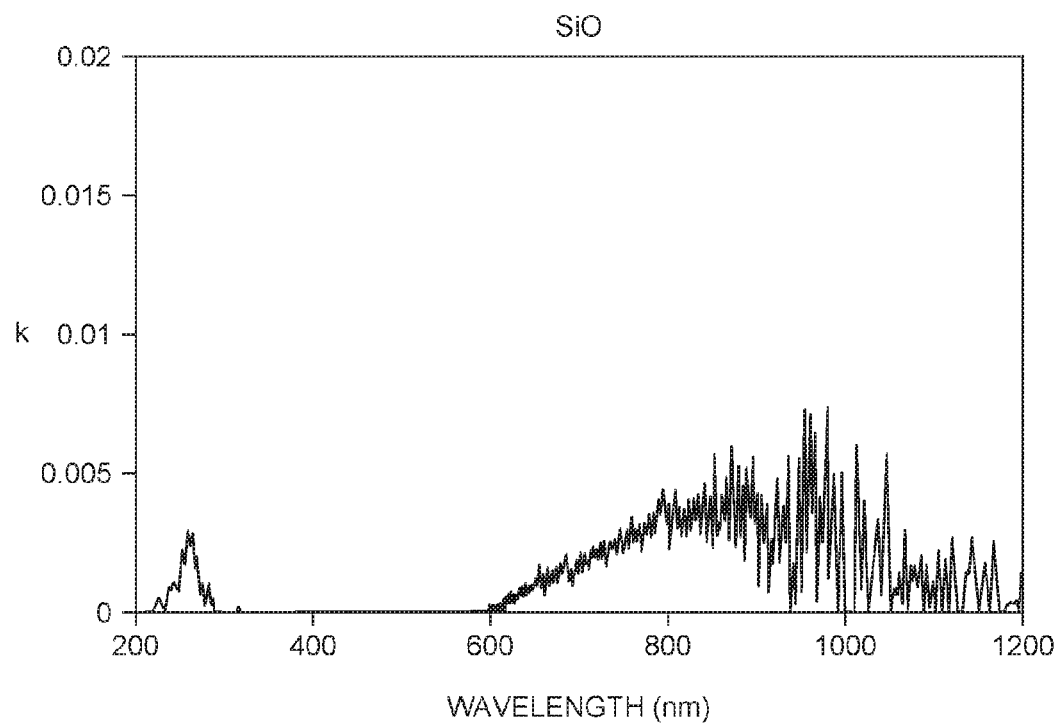
FIG. 8B is a chart mapping typical energy-dispersive k values over a range of wavelengths for a SiO layer.

Gate interface layer and interlayer dielectric 230 may each comprise two layers as shown in the close-up of FIG. 2. The gate interface layer may comprise inorganic layers. For example, the gate interface layer may comprise a layer of SiO 232 and a layer of SiN 234. Similarly, the interlayer dielectric may comprise a layer of SiO 236 and a layer of SiN 238. As shown in FIG. 7A, the refractive index (n) of SiN ranges from about 1.8 to 2.0, for example, 1.9. As shown in FIG. 7B, the refractive index (n) of SiO ranges from 1.4-1.48, for example, 1.46. The refractive index differential between the SiO and SiN layers is significant enough to cause some reflection at the interface of the SiO layer 232 and the SiN layer 234. Because these layers extend over the pixel electrode layer, reflection will disturb optical transmittance. Similarly, as shown in FIGS. 8A and 8B, the extinction coefficient (k) of SiN differs from the extinction coefficient (k) of SiO over a range of wavelengths. The extinction coefficient differential results in attenuation of light as it passes through the medium. The attenuation results in disturbance of optical transmittance. As a result, for the gate interface, an additional layer or set of layers may be disposed between the SiO layer 232 and the SiN layer 234. This layer or set of layer is a transition layer 233. Similarly, for the interlayer dielectric, an additional layer or set of layers may be disposed between the SiO layer 236 and the SiN layer 238. This layer or set of layer is a transition layer 237. The composition of the transition layer 233, 237 is a graded layer or set of layers of SiO, SiN, and SiON that provide a refractive index between the refractive index of SiO and the refractive index of SiN. This transition layer 233, 237 may comprise at least two sublayers with varying content of O and N to graduate the refractive index differential between the SiO and SiN layers 232 and 234 and between the SiO and SiN layers 236 and 238. By reducing or graduating the refractive index differential, the reflection is also reduced and optical transmission is enhanced.

Figure 3A:
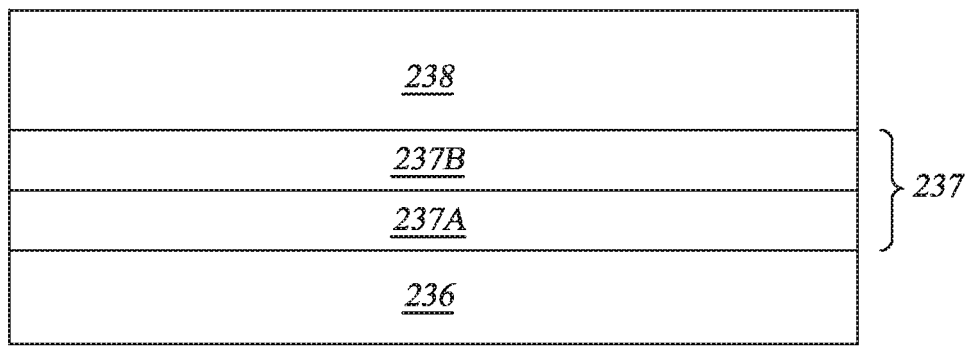
FIG. 3A is a schematic cross-sectional view of a detail of a thin film transistor device according to another embodiment.

For example, one embodiment of this reflection-reducing transition layer is shown in FIG. 3A. In FIG. 3A, SiO sublayer 236 of interlayer dielectric is separated from SiN sublayer 238 of interlayer dielectric by a transition layer 237 (shown in FIG. 2). In FIG. 3A, transition layer 237 may comprise at least two sublayers 237A and 237B. Interlayer dielectric transition sublayers 237A, 237B may comprise both SiO and SiN. However, interlayer dielectric transition sublayer 237A, which is disposed over interlayer dielectric SiO layer 236, may have a higher concentration of SiO and a lower concentration of SiN. Similarly, interlayer dielectric transition sublayers 237B, which is disposed over interlayer dielectric transition sublayers 237A and under interlayer dielectric SiN sublayer 238, may have a lower concentration of SiO and a higher concentration of SiN. The concentrations of SiO and SiN in the transition sublayers may be controlled by controlling flow rates of SiO and SiN into the processing chamber 100 during deposition of the layers. Although the embodiment in FIG. 3A shows only two interlayer dielectric transition sublayers, it is also possible to have many more interlayer dielectric transition layers in which the levels of SiO and SiN are adjusted such that the concentration of SiO gradually decreases and the concentration of SiN in successive layers gradually increases for each transition layer. By gradually shifting the concentrations of SiO and SiN, the differential in the refractive index is minimized, resulting in improved optical transmittance.

Figure 3B:
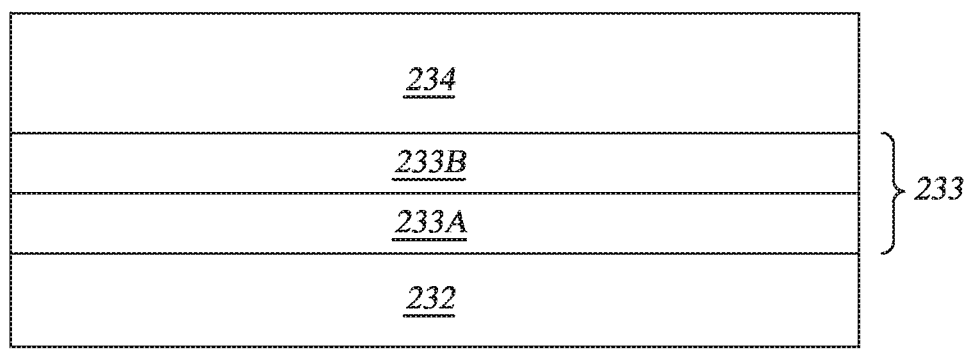
FIG. 3B is a schematic cross-sectional view of a detail of a thin film transistor device according to another embodiment.

FIG. 3B shows a similar embodiment of a detail of a thin film transistor for the gate interface layer. In FIG. 3B, SiO sublayer 232 of gate interface is separated from SiN sublayer 234 of gate interface by a transition layer 233 (shown in FIG. 2). In FIG. 3B, transition layer 233 may comprise at least two sublayers 233A and 233B. Gate interface transition sublayers 233A, 233B may comprise both SiO and SiN. However, gate interface transition sublayer 233A, which is disposed over interlayer dielectric SiO layer 232, may have a higher concentration of SiO and a lower concentration of SiN. Similarly, interlayer dielectric transition sublayers 233B, which is disposed over interlayer dielectric transition sublayers 233A and under interlayer dielectric SiN sublayer 234, may have a lower concentration of SiO and a higher concentration of SiN. The concentrations of SiO and SiN in the transition sublayers may be controlled by controlling flow rates of SiO and SiN into the processing chamber 100 during deposition of the layers. Although the embodiment in FIG. 3B shows only two gate interface transition sublayers, it is also possible to have many more gate interface transition layers in which the levels of SiO and SiN are adjusted such that the concentration of SiO gradually decreases and the concentration of SiN in successive layers gradually increases for each transition layer. By gradually shifting the concentrations of SiO and SiN, the differential in the refractive index is minimized, resulting in improved optical transmittance.

FIG. 4 shows another embodiment of the LPTS thin film transistor illustrated in FIG. 2. In FIG. 4, the buffer layer 220 may comprise two sublayers 222 and 224. Buffer sublayers 222 and 224 may comprise inorganic layers. For example, buffer sublayer 222 may comprise SiN and buffer sublayer 224 may comprise SiO. As in the gate interface and interlayer dielectrics, the differential between the refractive indices of SiO and SiN may result in reflective interference. To reduce reflection, one or more transition layers 223 may be disposed between the SiO layer 222 and the SiN layer 224.

Figure 5:
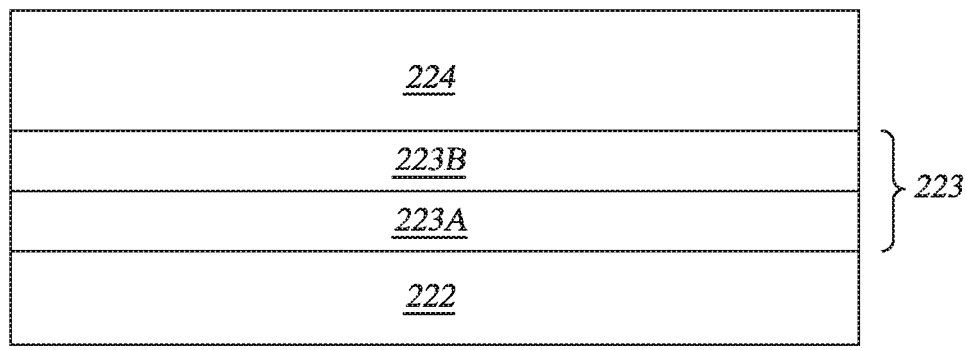
FIG. 5 is a schematic cross-sectional view of a detail of a thin film transistor device according to another embodiment.

FIG. 5 illustrates one embodiment in which the buffer transition layer 223 comprises at least two transition sublayers. Buffer transition sublayer 223A is disposed over buffer sublayer 222, comprising SiN. Buffer transition sublayer 223A may comprise both SiO and SiN but a higher concentration of SiN than of SiO. Buffer transition sublayer 223B is disposed over buffer transition sublayer 223A and under buffer sublayer 224. Buffer transition sublayer 223B may comprise both SiO and SiN, but a higher concentration of SiO than of SiN. Again, the concentration of SiO and SiN in the sublayers is controlled by controlling flow rates of oxygen and nitrogen into the processing chamber during deposition. The use of transition sublayers reduces the differential between the refractive indices of each sublayer, reducing reflective interference and improving optical transmission.

As discussed, the refractive index differential between CVD-deposited SiN and SiO can limit optical transmittance between layers over a pixel electrode, resulting in diminished performance. To reduce this effect, transition layers are deposited between SiO and SiN layers. These transition layers lead to reductions in the changes in the refractive index between layers, which in turn lead to reduced reflective interference and improved optical transmittance at a limited increase in cost.

While the foregoing is directed to embodiments of the present invention, other and further embodiments of the invention may be devised without departing from the basic scope thereof, and the scope thereof is determined by the claims that follow.

The invention claimed is:

1. A thin film transistor, comprising:
a substrate;
two dual layers disposed over the substrate, each dual layer comprising:
a first inorganic layer having a first refractive index;
a second inorganic layer having a second refractive index, the first refractive index being less than the second refractive index; and
a transition stack disposed between the first inorganic layer and the second inorganic layer, the transition stack comprising at least a third inorganic layer and a fourth inorganic layer, wherein:
the third inorganic layer is disposed on the first inorganic layer and has a third refractive index;
the fourth inorganic layer is disposed on the third inorganic layer and has a fourth refractive index;
the third refractive index is greater than the first refractive index and less than the fourth refractive index; and
the fourth refractive index is greater than the third refractive index and less than the second refractive index.

2. The thin film transistor of claim 1, wherein the first inorganic layer comprises silicon oxide and the second inorganic layer comprises silicon nitride and is disposed on the fourth inorganic layer.

3. The thin film transistor of claim 1, further comprising:
a layer of indium tin oxide disposed over the two dual layers.

4. The thin film transistor of claim 3, further comprising:
a polymer layer disposed over the two dual layers and under the indium tin oxide layer.

5. The thin film transistor of claim 1, further comprising:
a blocking layer disposed over the substrate and under the two dual layers, the blocking layer comprising:
a fifth inorganic layer having a fifth refractive index;
a sixth inorganic layer having a sixth refractive index, the fifth refractive index being greater than the sixth refractive index; and
a transition stack disposed between the fifth inorganic layer and the sixth inorganic layer, the transition stack comprising at least a seventh inorganic layer and an eighth inorganic layer, wherein:
the seventh inorganic layer is disposed on the fifth inorganic layer and has a seventh refractive index;
the eighth inorganic layer is disposed on the seventh inorganic layer and has an eighth refractive index;

the seventh refractive index is less than the fifth refractive index and greater than the eighth refractive index; and
the eighth refractive index is less than the seventh refractive index and greater than the sixth refractive index.
6. The thin film transistor of claim 5, wherein the fifth inorganic layer comprises silicon nitride and the sixth inorganic layer comprises silicon oxide.
7. The thin film transistor of claim 6, wherein:
the first inorganic layer comprises silicon nitride; and
the second inorganic layer comprises silicon oxide.
8. The thin film transistor of claim 5, further comprising:
a layer of indium tin oxide disposed over the two dual layers.
9. The thin film transistor of claim 8, further comprising:
a polymer layer disposed over the two dual layers and under the indium tin oxide layer.
10. The thin film transistor of claim 9, further comprising:
a polyimide layer disposed over the indium tin oxide layer.
11. A thin film transistor, comprising:
a glass substrate;
a gate insulator dual layer disposed over the glass substrate, the gate insulator dual layer comprising:
 a first inorganic layer having a first refractive index;
 a second inorganic layer having a second refractive index, the first refractive index being less than the second refractive index; and
 a transition stack disposed between the first inorganic layer and the second inorganic layer, the transition stack comprising at least a third inorganic layer and a fourth inorganic layer, wherein:
  the third inorganic layer is disposed on the first inorganic layer and has a third refractive index;
  the fourth inorganic layer is disposed on the third inorganic layer and has a fourth refractive index;
  the third refractive index is greater than the first refractive index and less than the fourth refractive index; and
  the fourth refractive index is greater than the third refractive index and less than the second refractive index;
an interlayer dielectric layer disposed over the gate insulator dual layer, the interlayer dielectric layer comprising:
 a fifth inorganic layer having a fifth refractive index;
 a sixth inorganic layer having a sixth refractive index, the fifth refractive index being less than the sixth refractive index; and
 a transition stack disposed between the fifth inorganic layer and the sixth inorganic layer, the transition stack comprising at least a seventh inorganic layer and an eighth inorganic layer, wherein:
  the seventh inorganic layer is disposed on the fifth inorganic layer and has a seventh refractive index;
  the eighth inorganic layer is disposed on the seventh inorganic layer and has an eighth refractive index;
  the seventh refractive index is greater than the fifth refractive index and less than the eighth refractive index; and
  the eighth refractive index is greater than the seventh refractive index and less than the sixth refractive index.
12. The thin film transistor of claim 11, wherein:
the first inorganic layer comprises silicon oxide;
the second inorganic layer comprises silicon nitride;
the fifth inorganic layer comprises silicon oxide; and
the sixth inorganic layer comprises silicon nitride.
13. The thin film transistor of claim 12, further comprising:
a layer of indium tin oxide disposed over the interlayer dielectric layer.
14. The thin film transistor of claim 13, further comprising:
a polymer layer between the indium tin oxide layer and the interlayer dielectric layer.
15. The thin film transistor of claim 11, further comprising:
a blocking layer disposed between the substrate and the gate insulator dual layer, the blocking layer comprising:
 a ninth inorganic layer having a ninth refractive index;
 a tenth inorganic layer having a tenth refractive index, the ninth refractive index being greater than the tenth refractive index; and
 a transition stack disposed between the ninth inorganic layer and the tenth inorganic layer, the transition stack comprising at least an eleventh inorganic layer and a twelfth inorganic layer, wherein:
  the eleventh inorganic layer is disposed on the ninth inorganic layer and has an eleventh refractive index;
  the twelfth inorganic layer is disposed on the eleventh inorganic layer and has a twelfth refractive index;
  the eleventh refractive index is less than the ninth refractive index and greater than the twelfth refractive index; and
  the twelfth refractive index is less than the eleventh refractive index and greater than the tenth refractive index.
16. The thin film transistor of claim 15, wherein:
the first inorganic layer comprises silicon oxide;
the second inorganic layer comprises silicon nitride;
the fifth inorganic layer comprises silicon oxide; and
the sixth inorganic layer comprises silicon nitride.
17. The thin film transistor of claim 16, wherein:
the ninth inorganic layer comprises silicon nitride; and
the tenth inorganic layer comprises silicon oxide.
18. The thin film transistor of claim 15, further comprising:
a layer of indium tin oxide disposed over the interlayer dielectric layer.
19. The thin film transistor of claim 18, further comprising:
a polymer layer disposed over the interlayer dielectric layer and over the indium tin oxide layer.
20. The thin film transistor of claim 19, further comprising:
a polyimide layer disposed over the indium tin oxide layer.
21. A transistor for controlling a pixel electrode, comprising:
a first interlayer dielectric layer, comprising silicon oxide;
a transition layer formed over the first interlayer dielectric layer, comprising silicon oxide and silicon nitride, wherein the transition layer comprises silicon oxide adjacent the first interlayer dielectric layer and silicon nitride adjacent the second interlayer dielectric layer; and
a second interlayer dielectric layer, comprising silicon nitride, wherein the pixel electrode is formed over the first interlayer dielectric layer, the transition layer, and the second interlayer dielectric layer.

* * * * *